US012120842B2

(12) United States Patent
Chen et al.

(10) Patent No.: US 12,120,842 B2
(45) Date of Patent: Oct. 15, 2024

(54) AIR DUCT WITH ONE OR MORE FINS

(71) Applicant: Quanta Computer Inc., Taoyuan (TW)

(72) Inventors: Chao-Jung Chen, Taoyuan (TW); Herman Tan, Taoyuan (TW); Tien-Juei Chuang, Taoyuan (TW); Chieh-Ling Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 350 days.

(21) Appl. No.: 17/829,869

(22) Filed: Jun. 1, 2022

(65) Prior Publication Data

US 2023/0397361 A1 Dec. 7, 2023

(51) Int. Cl.
*H05K 7/20* (2006.01)

(52) U.S. Cl.
CPC ..... *H05K 7/20145* (2013.01); *H05K 7/20209* (2013.01)

(58) Field of Classification Search
CPC ....... H05K 7/20; H05K 7/20136–2029; H05K 7/20209; H05K 7/2039; H05K 7/20509; H05K 7/20563; H05K 7/20736; H05K 7/20909–20918; H05K 1/0272; H05K 2201/064; H01L 23/36; H01L 23/40; H01L 23/427; H01L 23/46; H01L 23/467; H01L 23/473; G06F 1/16; G06F 1/20; G06F 1/203; G06F 2200/201; H01R 12/724
See application file for complete search history.

(56) References Cited

U.S. PATENT DOCUMENTS

| 5,335,143 A * | 8/1994 | Maling, Jr. ........ H05K 7/20154 165/122 |
| 5,361,188 A * | 11/1994 | Kondou ................ H01L 23/467 165/104.34 |
| 6,650,538 B1 * | 11/2003 | Chu ...................... H01L 23/467 257/722 |
| 2012/0014067 A1 * | 1/2012 | Siracki ................ H01L 23/3672 165/185 |
| 2016/0360641 A1 * | 12/2016 | Fujii .................. H05K 7/20736 |
| 2017/0112018 A1 * | 4/2017 | Krivonak ........... H05K 7/20927 |
| 2020/0137923 A1 * | 4/2020 | Qu ..................... H05K 7/20145 |
| 2021/0234215 A1 * | 7/2021 | Nakahama ........ H01M 10/6556 |

* cited by examiner

*Primary Examiner* — Amir A Jalali
(74) *Attorney, Agent, or Firm* — NIXON PEABODY LLP

(57) ABSTRACT

An air duct is disclosed. The air duct includes a housing for directing air over a plurality of slots within a computer system. The housing includes side housing walls and a top housing wall. The side housing walls are respectively connected to opposing ends of the top housing wall. The side housing walls extend in the same direction from the top housing wall. The air duct further includes a plurality of fins extending from the top housing wall in the same direction as the side housing walls. Each fin of the plurality of fins is arranged on the top housing wall so as to be positioned between adjacent slots of the plurality of slots when the housing is located within the computer system.

16 Claims, 9 Drawing Sheets

AIR DUCT WITH ONE OR MORE FINS

FIELD OF THE INVENTION

The present invention relates generally to an air duct, and more specifically, to an air duct for directing air between components within a computer system, such as a rack server computer system.

BACKGROUND OF THE INVENTION

Computer systems, and particularly rack server computer systems, are being equipped with an increasingly large number of components in a similar, or even increasingly smaller, footprint or chassis. This has made air flow needed to regulate the temperature of the components within the computer systems an ever challenging issue to handle.

An example of a component within a computer system for which the temperature must be regulated is a dual in-line memory module (DIMM). Computer systems, and particularly rack server computer systems, can be equipped with many DIMMs to satisfy complex computing requirements, such as numerical simulations, artificial intelligence, large data processing, etc. An unmanaged DIMM temperature can affect system performance or even worse, such as cause a high annual failure rate. Thus, air ducts are used within computer systems to manage or direct airflow over DIMMs, which dissipates heat generated by the DIMMs so that the DIMMs operate within a safe temperature range. However, typical air ducts specific for DIMMs only manage airflow through each DIMM bank as a whole.

For example, FIG. 1 shows a typical air duct design for with respect to directing airflow over DIMMs in a conventional rack server system 100. The system 100 includes a chassis 101 formed of a bottom chassis wall 102 with a front 104 and a back 106. The chassis 101 also includes side chassis walls 108 extending from the front 104 to the back 106. Attached to the bottom chassis wall 102 of the chassis 101 is a system board 109, such as a motherboard. Attached to the system board 109 are a plurality of DIMMs 110 that extend away from the system board 109 and generally parallel to the side chassis walls 108. Air ducts 112 in the chassis 101 direct airflow into the front 104, over the DIMMs 110, and out the back 106 in the direction of the arrow 114. Although the air ducts 112 improve cooling of the DIMMs 110, the DIMMs 110 can still overheat, causing the above-referenced problems.

The present disclosure is directed to solving the above-referenced problems by providing an air duct with fins that direct air across components within computer systems for improved heat dissipation.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one embodiment of the present disclosure, an air duct is disclosed. The air duct includes a housing for directing air over a plurality of slots within a computer system. The housing includes side housing walls and a top housing wall. The side housing walls are respectively connected to opposing ends of the top housing wall. The side housing walls extend in the same direction from the top housing wall. The air duct further includes a plurality of fins extending from the top housing wall in the same direction as the side housing walls. Each fin of the plurality of fins is arranged on the top housing wall so as to be positioned between adjacent slots of the plurality of slots when the housing is located within the computer system.

According to one aspect of the above embodiment, each fin of the plurality of fins is a quadrilateral with a declined front edge. According to another aspect of the above embodiment, each fin of the plurality of fins includes a projection extending down from a bottom of the fin. According to another aspect of the above embodiment, each fin of the plurality of fins is about 1 millimeters (mm) to about 3 mm thick. According to another aspect of the above embodiment, each fin of the plurality of fins is 2 mm thick. According to another aspect of the above embodiment, each fin of the plurality of fins is about 35 mm to about 95 mm long. According to another aspect of the above embodiment, each fin of the plurality of fins is 74.35 mm long. According to another aspect of the above embodiment, each fin of the plurality of fins is about 10 mm to about 40 mm tall. According to another aspect of the above embodiment, each fin of the plurality of fins is 15.4 mm tall. According to another aspect of the above embodiment, the top housing wall includes a declined portion at a front of the air duct, and the plurality of fins extend from the top housing wall starting from behind the declined portion.

According to another embodiment of the present disclosure, a computer system is disclosed. The computer system includes a chassis having a front, a back, two side chassis walls, and a bottom chassis wall. The computer system further includes a board connected to the bottom chassis wall. The board has a plurality of slots facing up from the bottom chassis wall. Each slot of the plurality of slots accepts a component. The computer system further includes an air duct connected to the board and positioned over the plurality of slots. The air duct includes a housing for directing air over the plurality of slots. The housing includes side housing walls that connect the air duct to the board and a top housing wall connected to and extending between the side housing walls. The air duct further includes a plurality of fins extending from the top housing wall towards the plurality of slots. Each fin of the plurality of fins is arranged on the top housing wall such that each component accepted in the plurality of slots is positioned between adjacent fins of the plurality of fins.

According to one aspect of the above embodiment, each fin of the plurality of fins is a quadrilateral with a declined front edge. According to another aspect of the above embodiment, each fin of the plurality of fins includes a projection extending from a bottom of the fin. According to another aspect of the above embodiment, the computer system further includes a plurality of components connected to the plurality of slots. The projection of each fin of the plurality of fins vertically aligns to be adjacent to a hottest portion of each component of the plurality of components. According to another aspect of the above embodiment, each fin of the plurality of fins is 2 mm thick. According to another aspect of the above embodiment, a pitch between the adjacent slots of the plurality of slots is 7.54 mm. According to another aspect of the above embodiment, the pitch between the adjacent slots of the plurality of slots is 7.54 mm and each fin of the plurality of fins is 2 mm thick. According to another aspect of the above embodiment, each fin of the plurality of fins is 74.35 mm long. According to another aspect of the above embodiment, each fin of the plurality of fins is 15.4 mm tall. According to another aspect of the above embodiment, the top housing wall of the air duct includes a declined portion at a front of the air duct, and the plurality of fins extend from the top housing wall starting from behind the declined portion.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
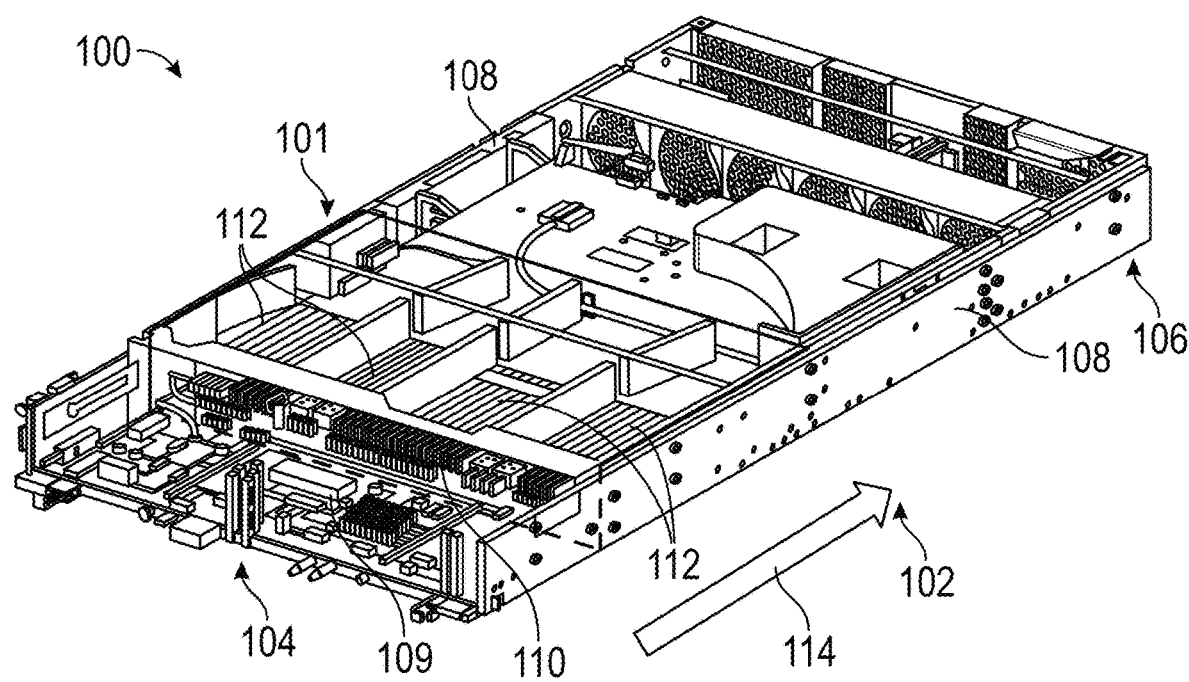
FIG. 1 shows a perspective view of a prior art computer system with a conventional air duct design for DIMMs.

While the invention is susceptible to various modifications and alternative forms, specific embodiments have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

Figure 2:
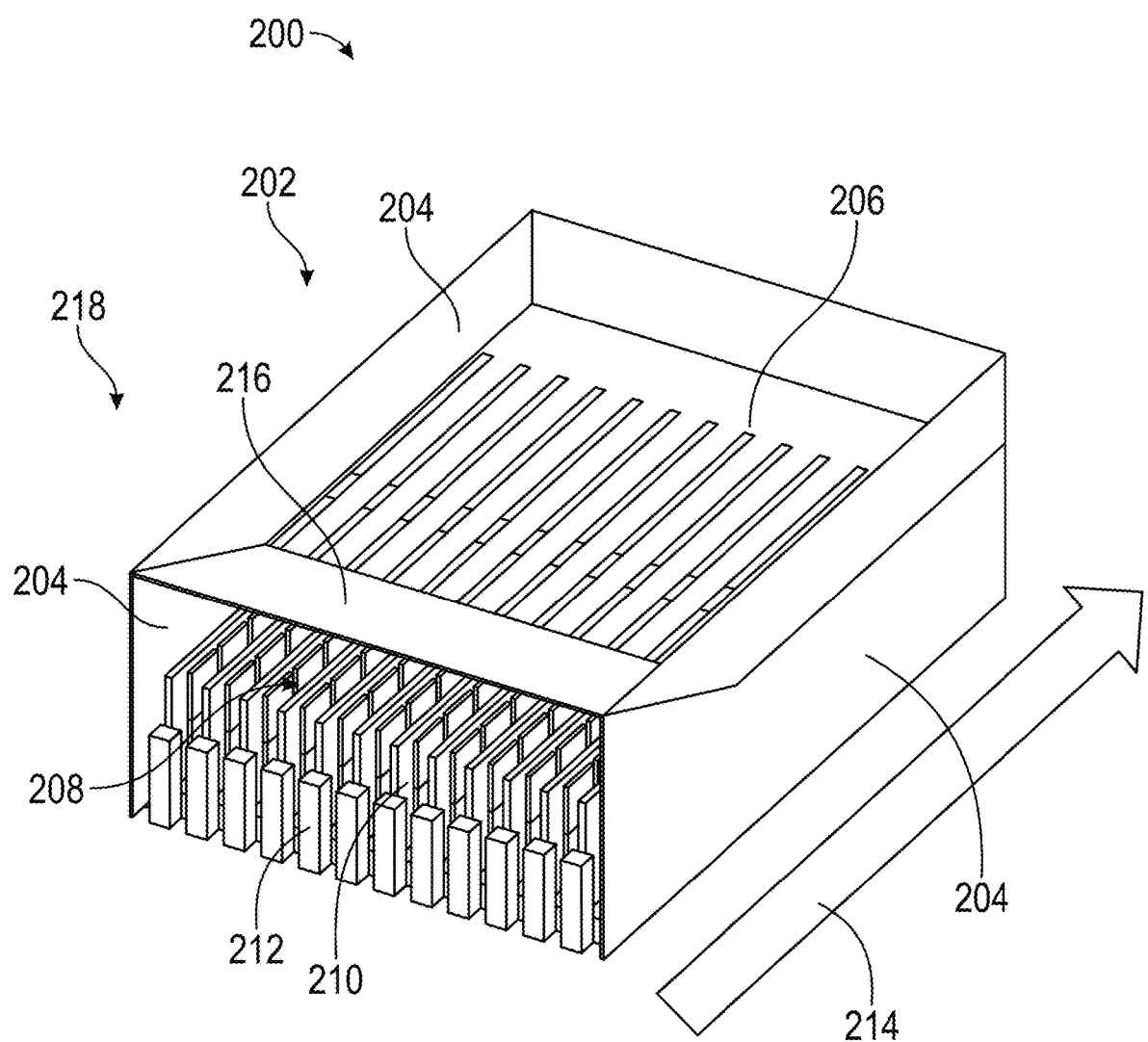
FIG. 2 shows perspective view of an air duct, according to an aspect of the present disclosure.

FIG. 2 shows perspective view of an air duct 200, according to an aspect of the present disclosure. The air duct 200 includes a housing 202 that includes generally parallel side housing walls 204. The housing 202 further includes a top housing wall 206 connected to and extending between the side housing walls 204. The top housing wall 206 and the side housing walls 204 define an opening 208. The opening 208 allows the housing 202 to be positioned on a circuit board, such as the system board 109 of FIG. 1, within a computer system, such as the computer system 100 of FIG. 1, so that the housing 202 covers components (e.g., DIMMs 110 of FIG. 1) coupled to the computer system. This allows the air duct 200 to direct air, represented by the arrow 214, through the opening 208 and over the components 210 for cooling. The housing 202 is further positioned to cover the slots 212 that retain the components 210. It is to be understood that the air duct design of the example air duct 200 may be used with any computer system or computer related device that includes DIMMs or other components requiring cooling, such as storage devices (e.g., JBODs), switches, routers, 5G telecommunication components, and the like.

In one or more embodiments, the top housing wall 206 includes a declined portion 216 at the front 218 of the air duct 200. The declined portion 216 allows for the area of the opening 208 to be larger, for collecting more air for cooling, but still provide clearance above a remainder of the top housing wall 206 of the air duct 200 beyond the front 218.

Figure 3:
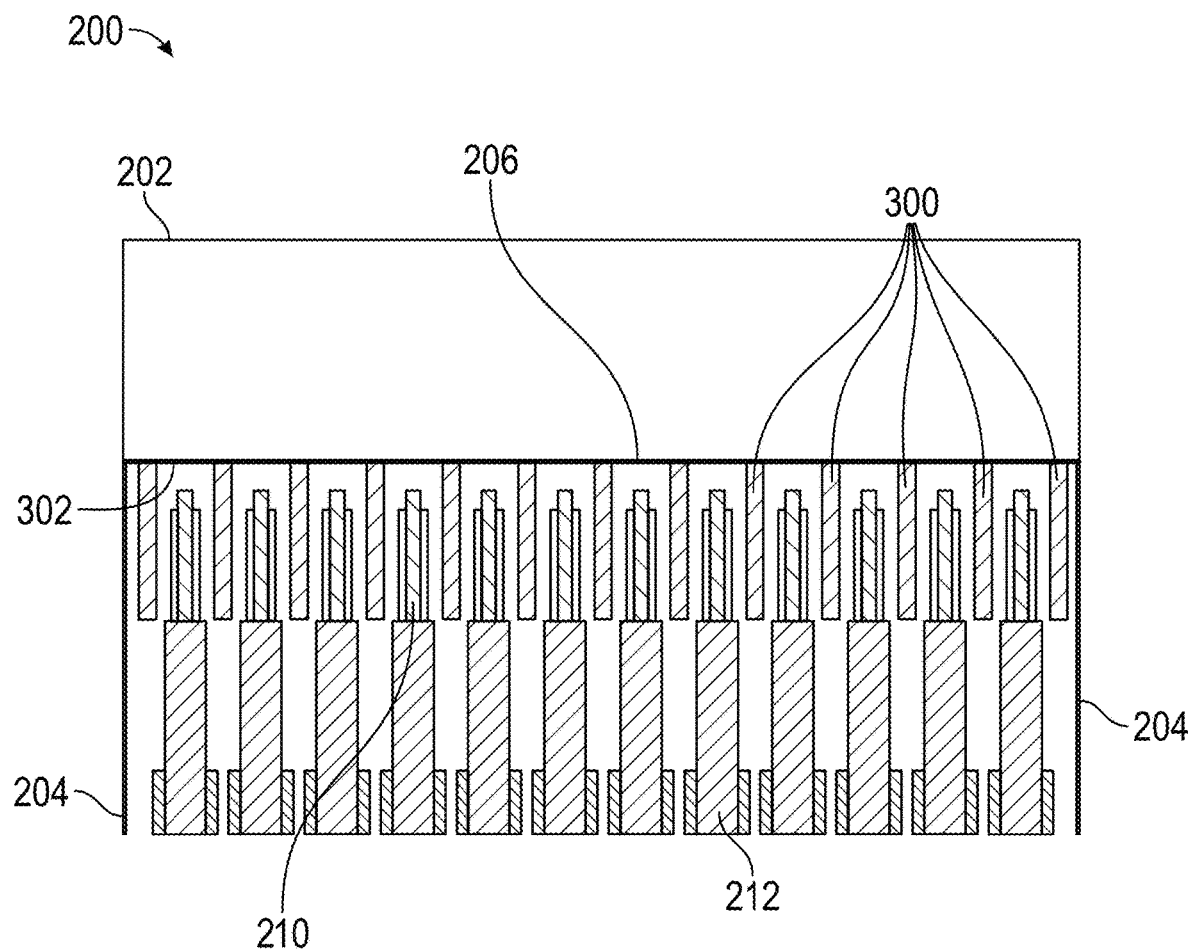
FIG. 3 shows a front view of the air duct of FIG. 2, according to an aspect of the present disclosure.

FIG. 3 shows a front view of the air duct 200 in FIG. 2, according to an aspect of the present disclosure. The air duct 200 includes a plurality of fins 300 that extend down from the top housing wall 206 of the housing 202. More specifically, the fins 300 are connected to a bottom surface 302 of the top housing wall 206, and extend down towards the components 210 and the slots 212. Each fin 300 is arranged to be positioned between adjacent slots 212. Thus, the fins 300 are positioned on the housing 202 in an alternating arrangement with the slots 212, with a fin 300 extending down between adjacent slots 212 and adjacent components 210. However, other arrangements are encompassed, such as a fin 300 extending down between every other slot 212 and component 210. In an embodiment of the air duct 200 that includes the declined portion 216, the fins 300 extend from the top housing wall 206 of the air duct 200 starting from beyond the declined portion 216.

Figure 4:
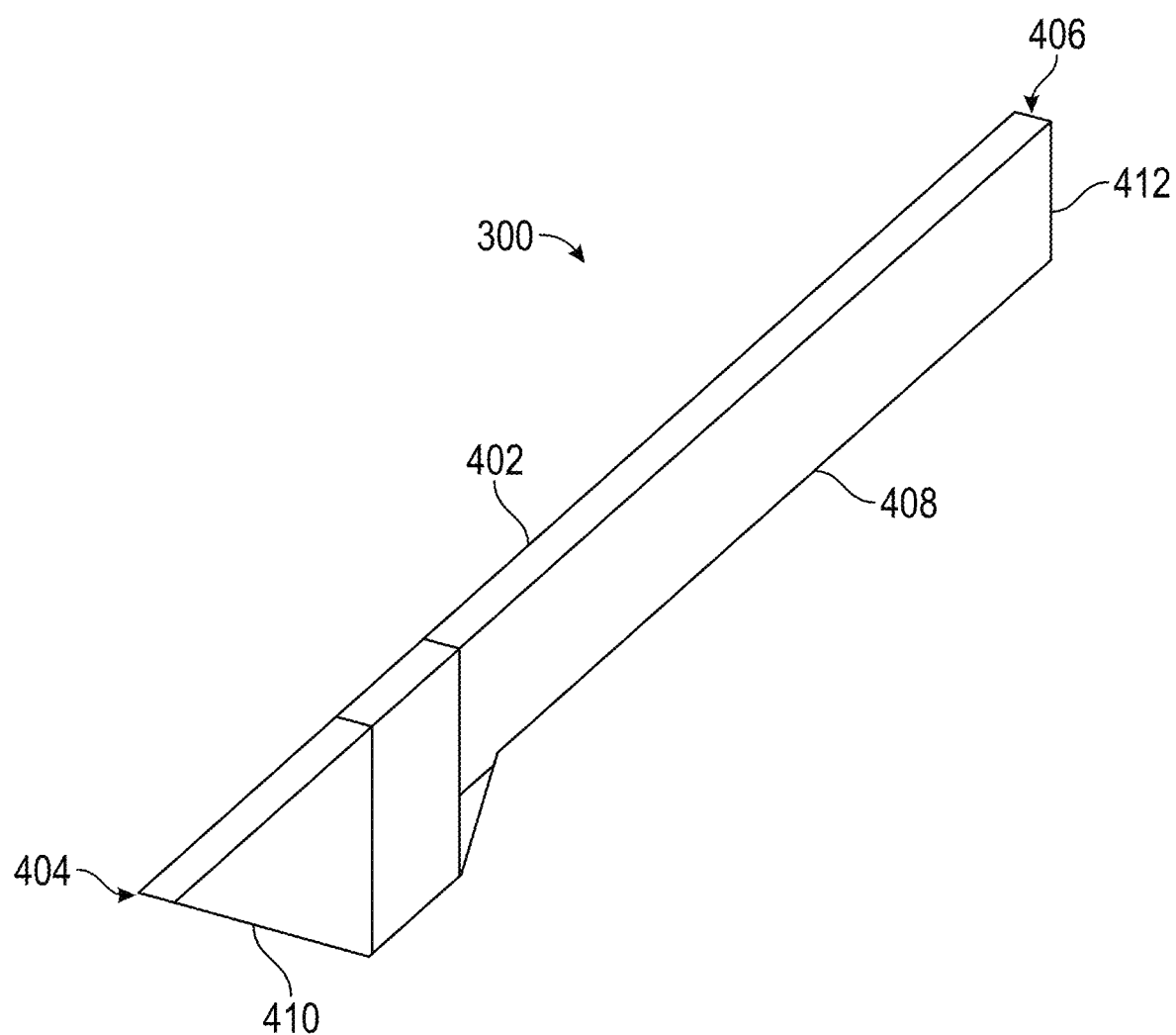
FIG. 4 shows a perspective view of a fin within an air duct, according to an aspect of the present disclosure.

FIG. 4 shows a perspective view of a fin 300, according to an aspect of the present disclosure. The fin 300 includes a top surface 402 that connects to the bottom surface 302 of the housing 202 (FIG. 3). The fin 300 further includes a front 404 and a back 406. The fin 300 also includes a bottom surface 408. The front 404 of the fin 300 can have a declined front edge 410, such that the declined front edge 410 is tapered downward and in the direction of airflow (arrow 214, FIG. 2). In contrast, the back 406 can have a straight vertical back edge 412. However, other shapes of the fin 300 are contemplated, such as those shown in FIGS. 6 and 7 and discussed below.

Figure 5:
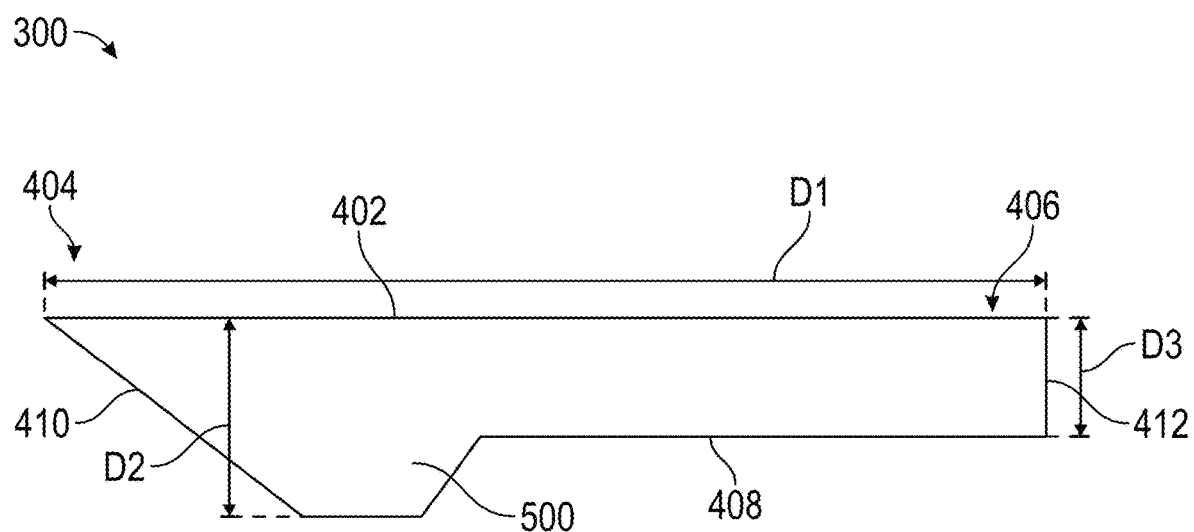
FIG. 5 shows a side view of the fin of FIG. 4, according to an aspect of the present disclosure.

FIG. 5 shows a side view of the fin 300 of FIG. 4, according to an aspect of the present disclosure. FIG. 5 shows the top surface 402 and bottom surface 408 of the fin 300, along with the declined front edge 410 and the straight vertical back edge 412.

The length D1 of the fin 300 can vary depending various factors, such as the size of the air duct 200, the size of the computer system, the location of the hottest portion of the corresponding component 210 about which the fin 300 is positioned, among others. In one or more embodiments, the length D1 of the fin 300 can be about 35 mm to about 95 mm, such as about 74.35 mm.

In one or more embodiments, the fin 300 can include a projection 500 on the bottom surface 408 formed from the declined front edge 410 at the front 404. The projection 500 can further direct air within the opening 208 (FIG. 2) of the air duct 200 for directed cooling of specific locations of the component 210 about which the fin 300 is positioned. In one or more embodiments, the height D2 of the fin 300 at the projection 500 can be about 10 mm to about 40 mm, such as about 15.4 mm. Beyond the projection 500, the height D3 can be about 10 mm to about 35 mm, such as about 9.4 mm.

Figure 6:
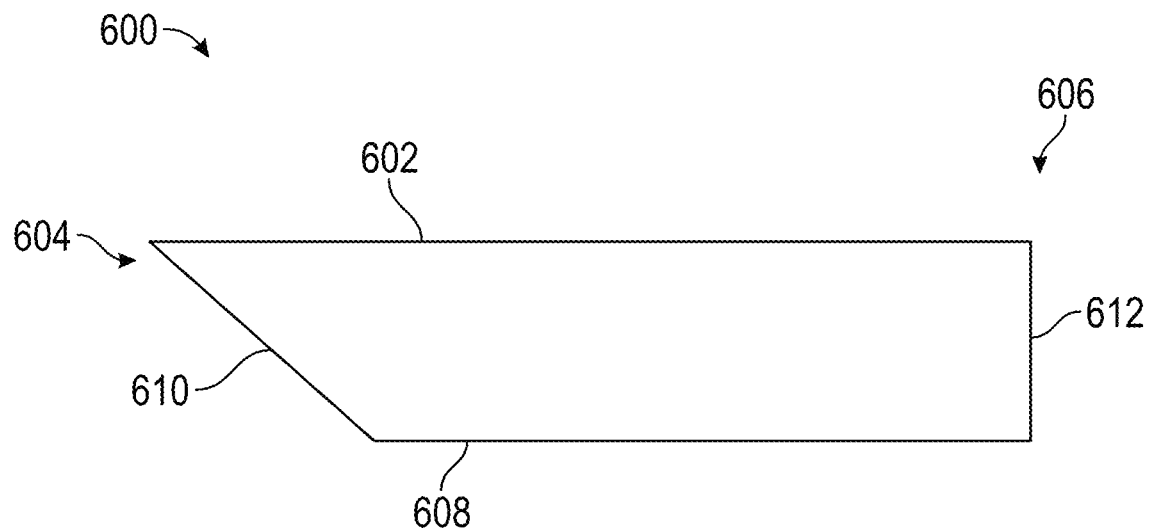
FIG. 6 shows a side view of a fin of an air duct, according to another aspect of the present disclosure.

FIG. 6 shows a side view of a fin 600, according to another aspect of the present disclosure. The fin 600 is similar to the fin 300, except that the fin 600 does not include a projection, such as the projection 500 of the fin 300 (FIG. 5). Thus, the fin 600 can instead have just a top surface 602, a bottom surface 608, a front 604 with a declined front edge 610, and a back 606 with a straight vertical back edge 612. In which case, the fin 600 has generally the shape of a quadrilateral with the declined front edge 610.

Figure 7:
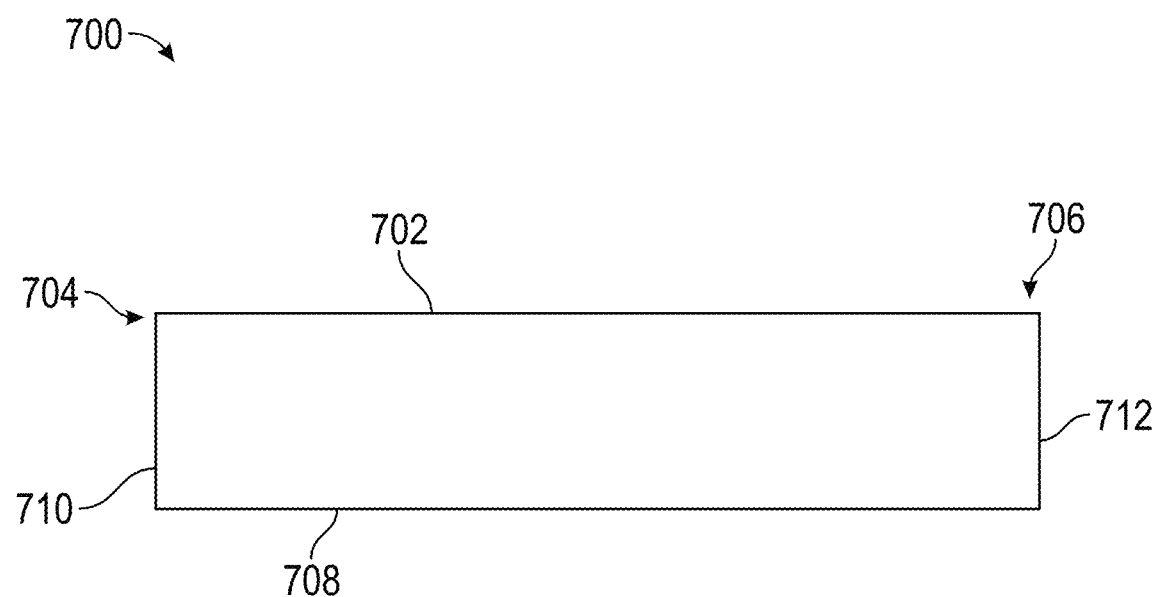
FIG. 7 shows a side view of a fin of an air duct, according to yet another aspect of the present disclosure.

FIG. 7 shows a side view of a fin 700, according to yet another aspect of the present disclosure. The fin 700 is similar to the fin 600, except that the fin 700 does not include a declined front edge, such as the declined front edge 610 of the fin 600 (FIG. 6). Thus, the fin 700 can instead have just a top surface 702, a bottom surface 708, a front 704 with a vertical front edge 710, and a back 706 with a straight vertical back edge 712. Thus, the fin 700 is generally the shape of a rectangle.

Various other shapes of fins 300, 600, and 700 are contemplated that can have specific geometries to provide specific directed cooling within computer systems. Thus, the present application is not limited to only the disclosed fins 300, 600, and 700.

Figure 8:
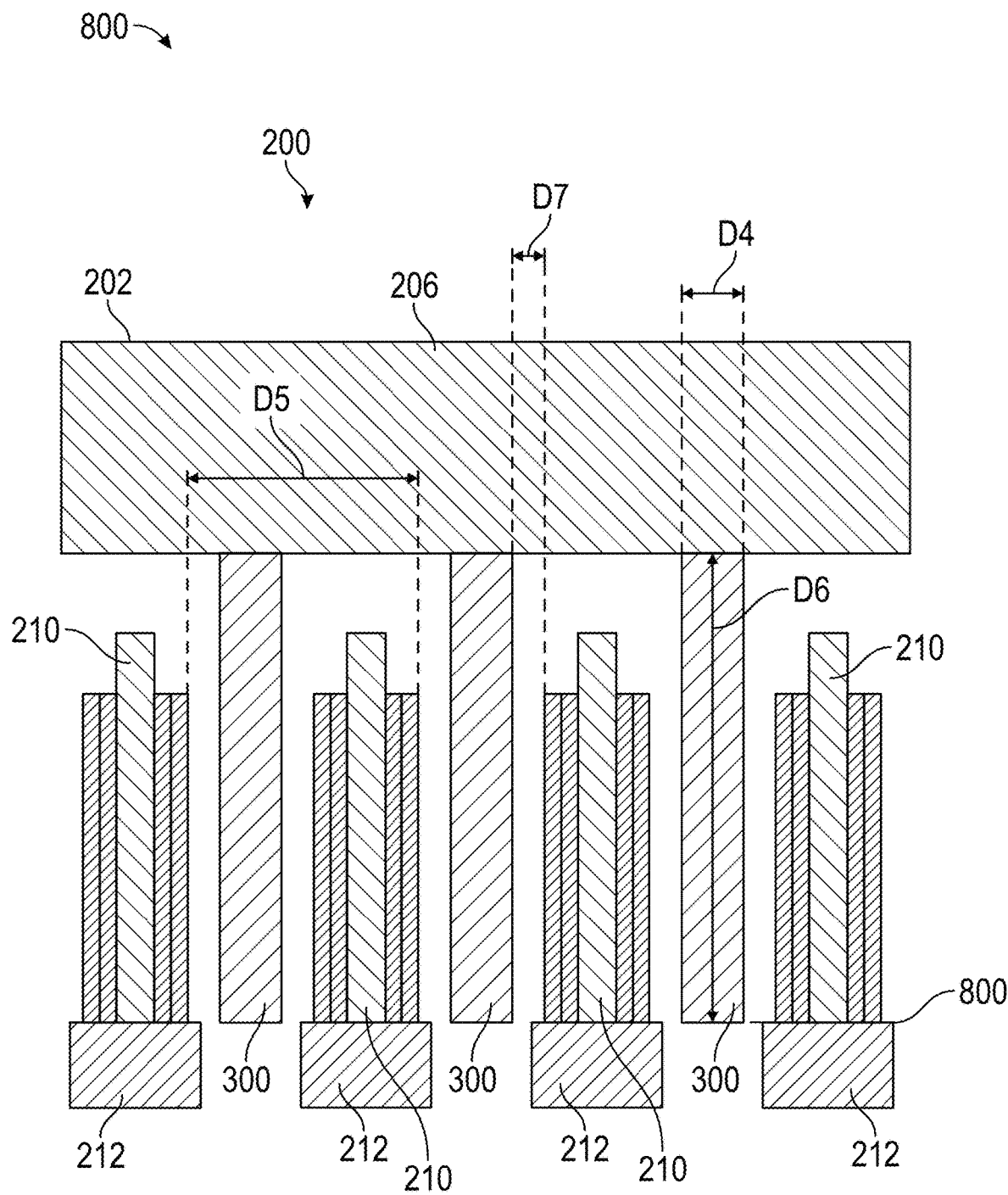
FIG. 8 shows a detailed front view of an air duct, according to an aspect of the present disclosure.

FIG. 8 shows a detailed side view of the air duct 200 relative to components 210 and slots 212 within a computer system 800, according to another aspect of the present disclosure. The thickness D4 of each fin 300 can be about 1 mm to about 3 mm thick, such as about 2 mm thick. The pitch D5 between adjacent components 210 and slots 212 of can be about 6 mm to about 10 mm wide, such as about 7.54 mm wide. This thickness D4 can be controlled based on the pitch D5 of components 210.

The maximum height D6 of the fin 300, such as height D2 in FIG. 5 for the fin 300 with the projection 500, can be about 10 mm to about 40 mm, such as about 15.4 mm. This height D6 can be determined based on the location of the hottest portion on the component 210 about which the fin 300 is located. For example, the bottom surface 408 (FIG. 5) of the fin 300 can be determined so as to be adjacent to the hottest portion on the component 210 about which the fin 300 is located. As an example, in an embodiment of a 1.5 U rack server computer system with a 7.54 mm pitch D5, the fin 300 can have a length D1 (FIG. 5) of about 74.35 mm, a maximum height D6 (and height D2 in FIG. 5) of 15.4 mm, and a thickness D4 of about 2 mm. With this arrangement, the space D7 between the fin 300 and adjacent components 210 is about 1.13 mm. This space provides the directed cooling over the components 210.

Figure 9:
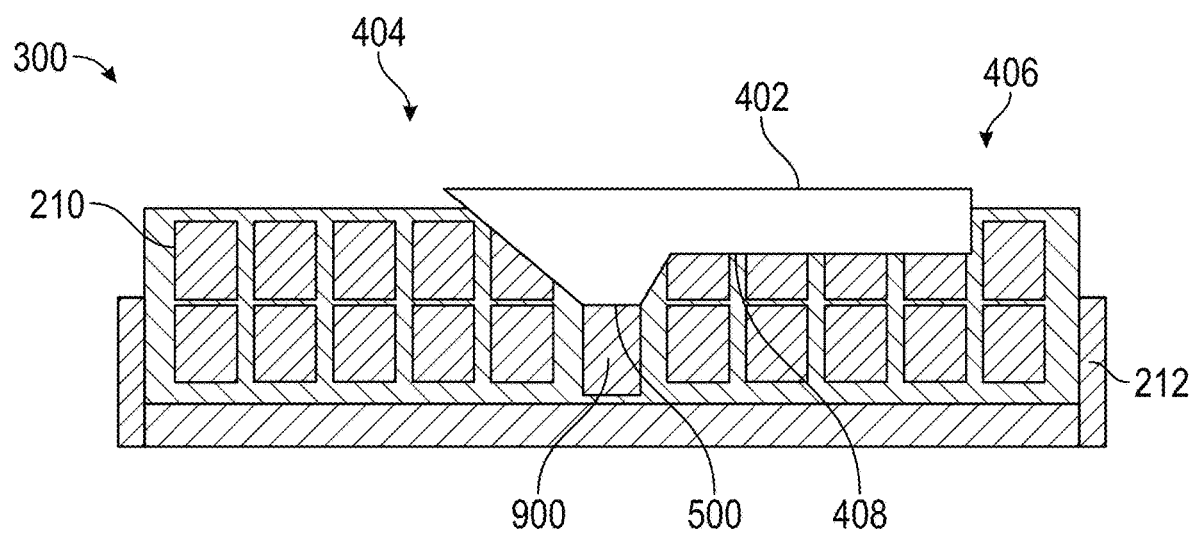
FIG. 9 shows a side view of a fin of an air duct positioned relative to a component, according to an aspect of the present disclosure.

FIG. 9 shows a side view of a fin 300 of an air duct 200 positioned relative to a component 210, with the component 210 within a slot 212, according to another aspect of the present disclosure. The hottest portion or element of the component 210 may be the element 900. For example, the element 900 can be a dynamic random-access memory (DRAM). Accordingly, the projection 500 can be positioned adjacent to the element 900 for directing airflow around the element 900, which improves the cooling provided to the element 900.

Figure 10:
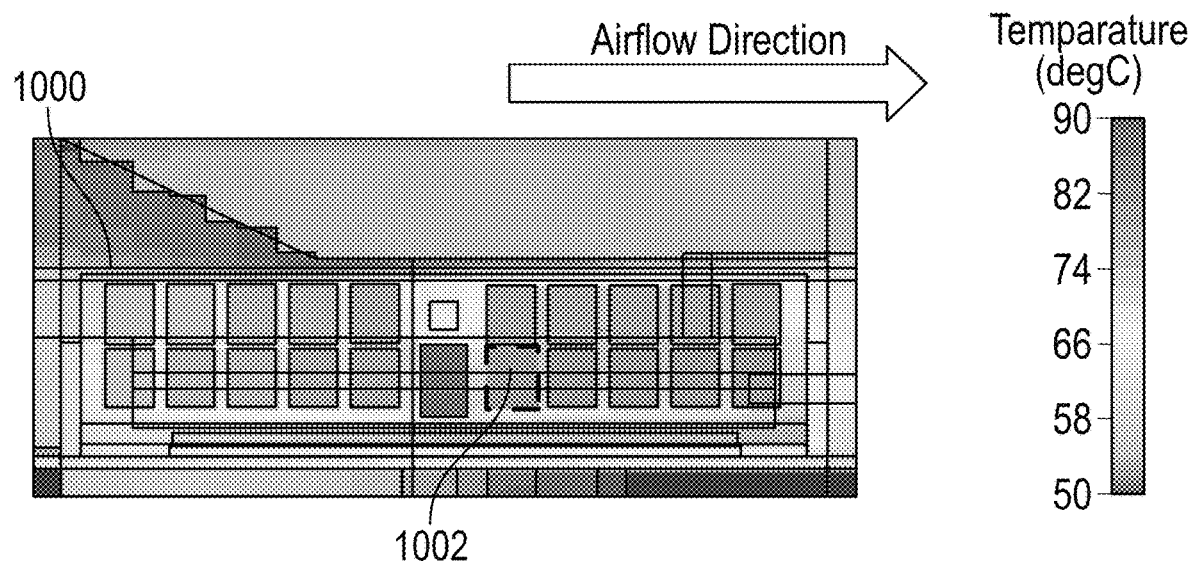
FIG. 10 shows a Computational Fluid Dynamics (CFD) simulation result of a component within a computer system cooled by airflow directed by a conventional air duct.

FIG. 10 shows a CFD image of component 1000 within a computer system without the air duct of the present disclosure. For the illustrated configuration, the inlet air temperature was 53.2° C. at a velocity of 4.2 m/s. As shown, the hottest element 1002 of the component 1000 can have a temperature of about 83° C.

Figure 11:
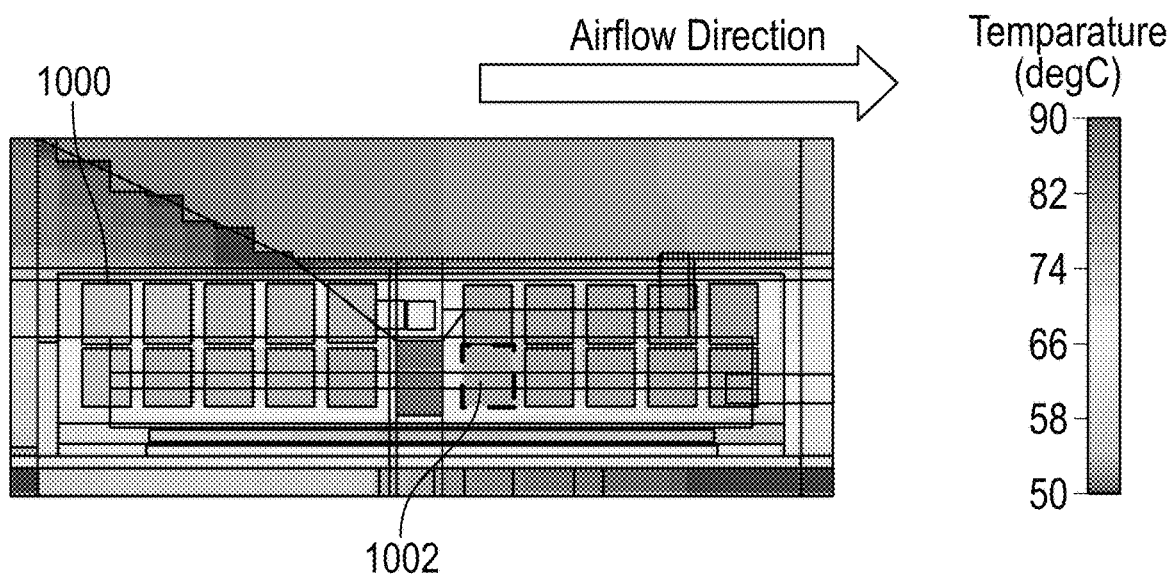
FIG. 11 shows a CFD simulation result of a component within a computer system cooled by airflow directed by an air duct of the present application with fins, according to an aspect of the present disclosure.

Referring to FIG. 11, the same setup as FIG. 10 is shown except that component 1000 is now surrounded by the air duct 200 (FIG. 2) within which is a fin 300 (FIG. 4). With the air duct 200 and the fin 300, the temperature of the hottest element 1002 of the component 1000 has a temperature of 80.3° C. Thus, adding the air duct 200 with the fin 300 can improve the temperature of the component 1000 by around 5.9% due to the fin 300 directing airflow around the component 1000.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An air duct comprising:
a housing for directing air over a plurality of slots within a computer system, the housing including side housing walls and a top housing wall, the side housing walls being respectively connected to opposing ends of the top housing wall, the side housing walls extending in the same direction from the top housing wall; and
a plurality of fins extending from the top housing wall in the same direction as the side housing walls, each fin of the plurality of fins being arranged on the top housing wall so as to be positioned between adjacent slots of the plurality of slots when the housing is located within the computer system,
wherein each fin of the plurality of fins is a quadrilateral with a declined front edge and includes a projection extending down from a bottom of the fin.

2. The air duct of claim 1, wherein each fin of the plurality of fins is about 1 millimeters (mm) to about 2 mm thick.

3. The air duct of claim 2, wherein each fin of the plurality of fins is 2 mm thick.

4. The air duct of claim 1, wherein each fin of the plurality of fins is about 35 mm to about 95 mm long.

5. The air duct of claim 4, wherein each fin of the plurality of fins is 74.35 mm long.

6. The air duct of claim 1, wherein each fin of the plurality of fins is about 10 mm to about 40 mm tall.

7. The air duct of claim 6, wherein each fin of the plurality of fins is 15.4 mm tall.

8. The air duct of claim 1, wherein the top housing wall includes a declined portion at a front of the air duct, and the plurality of fins extend from the top housing wall starting from behind the declined portion.

9. A computer system comprising:
a chassis having a front, a back, two side chassis walls, and a bottom chassis wall; a board connected to the bottom chassis wall, the board having a plurality of slots facing up from the bottom chassis wall, each slot of the plurality of slots accepting a component; and
an air duct connected to the board and positioned over the plurality of slots, the air duct including:
a housing for directing air over the plurality of slots, the housing including side housing walls that connect the air duct to the board and a top housing wall connected to and extending between the side housing walls; and
a plurality of fins extending from the top housing wall towards the plurality of slots, each fin of the plurality of fins being arranged on the top housing wall such that each component accepted in the plurality of slots is positioned between adjacent fins of the plurality of fins,
wherein each fin of the plurality of fins is a quadrilateral with a declined front edge and includes a projection extending down from a bottom of the fin.

10. The computer system of claim 9, further comprising a plurality of components connected to the plurality of slots, wherein the projection of each fin of the plurality of fins vertically aligns to be adjacent to a hottest portion of each component of the plurality of components.

11. The computer system of claim 9, wherein each fin of the plurality of fins is about 1 mm to 3 mm thick.

12. The computer system of claim 11, wherein a pitch between adjacent slots of the plurality of slots is about 6 mm to about 10 mm.

13. The computer system of claim 12, wherein the pitch between the adjacent slots of the plurality of slots is 7.54 mm and each fin of the plurality of fins is 2 mm thick.

14. The computer system of claim 13, wherein each fin of the plurality of fins is about 35 to 95 mm long.

15. The computer system of claim 14, wherein each fin of the plurality of fins is about 10 to 40 mm tall.

16. The computer system of claim 11, wherein the top housing wall includes a declined portion at a front of the air duct, and the plurality of fins extend from the top housing wall starting from behind the declined portion.

* * * * *